(12) United States Patent
Saito et al.

(10) Patent No.: US 7,698,290 B2
(45) Date of Patent: Apr. 13, 2010

(54) ERROR CORRECTION METHOD AND APPARATUS

(75) Inventors: Koichi Saito, Tokyo (JP); Youichi Fukada, Tokyo (JP); Yoichi Maeda, Tokyo (JP); Kiyomi Kumozaki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 450 days.

(21) Appl. No.: 11/661,575

(22) PCT Filed: Aug. 1, 2006

(86) PCT No.: PCT/JP2006/315215

§ 371 (c)(1),
(2), (4) Date: Feb. 28, 2007

(87) PCT Pub. No.: WO2007/029432

PCT Pub. Date: Mar. 15, 2007

(65) Prior Publication Data

US 2009/0055704 A1 Feb. 26, 2009

(30) Foreign Application Priority Data

Sep. 1, 2005 (JP) .............................. 2005-253275
Jun. 6, 2006 (JP) .............................. 2006-157186

(51) Int. Cl.
*G06F 17/30* (2006.01)

(52) U.S. Cl. .............................. 707/101; 707/7; 707/10; 714/784; 714/755; 714/701

(58) Field of Classification Search .................. 707/10, 707/100–102, 104.1, 1–7; 714/701, 755, 714/784
See application file for complete search history.

(56) References Cited

U.S. PATENT DOCUMENTS 6,061,820 A * 5/2000 Nakakita et al. ............. 714/751
6,907,561 B2 * 6/2005 Kojima ....................... 714/784
7,509,558 B2 * 3/2009 Muller et al. ............... 714/756
2005/0251726 A1 * 11/2005 Takamura .................... 714/755

FOREIGN PATENT DOCUMENTS

| JP | 03-254240 A | 11/1991 |
| JP | 04-207734 A | 7/1992 |
| JP | 05-191439 B2 | 7/1993 |
| JP | 07-202907 A | 8/1995 |

OTHER PUBLICATIONS

"Electronics Essentials No. 20, Essential Points of Error Correction Codes", supervised by Hideki Imai, Japan Industry Center.

(Continued)

*Primary Examiner*—Debbie M Le
(74) *Attorney, Agent, or Firm*—Harness, Dickey & Pierce, P.L.C.

(57) ABSTRACT

A transmitting apparatus arranges data in matrix, calculates error correction codes in the data's column direction, arranges the calculated error correction codes in matrix having the same number of columns as the data, attaches number information corresponding to a row number to each row having data or error correction code, encapsulates, into each packet, each row having number information and data or error correction code, plus error detection code detecting one or more bit errors at least in the number information and the data or error correction code in the packet, and transmits the packet. Receiving apparatus discards received packets having detected errors using the error detection code in each packet, checks packet losses according to number information, and restores lost data using the error correction codes. An error correction method compensates for packet losses and bit errors in a packet, realizing efficient transmission with less delay by simple configuration.

5 Claims, 9 Drawing Sheets

OTHER PUBLICATIONS

"Digital Broadcast Handbook", supervised by Osamu Yamada, edited by the Institute of Image Information and Television Engineers, Ohmu-Sha Ltd., pp. 18-19.

ITU-R Recommendation BT. 1306-1.

"A Bit Error and Cell Loss Compensation Method for ATM Transport Systems", by Ryoichi Iwase and Hitoshi Ohara, the Japanese-language Transactions of the Institute of Electronics, Information and Communication Engineers, J75-B1, No. 1, pp. 1-11.

"Application Examples of Error Correction Encoding Techniques <Digital Recording Edition>", supervised by Hiroshi Harashima, published by Triceps Co., Ltd., pp. 43-44 and pp. 67-68.

International Preliminary Report on Patentability (Form PCT/IB/326) on PCT/JP2006315215, filed Aug. 1, 2006.

* cited by examiner

| data #1 | data #2 | data #3 | dummy data | data #5 | ... | data #M | outer code #M+1 | ... | outer code #M+m |

| data A-1 | data A-2 | outer code A |
| dummy | data B-2 | outer code B |
| data C-1 | data C-2 | outer code C |
| data D-1 | data D-2 (error) | outer code D |
| inner code Z-1 | inner code Z-2 | inner code Z-3 |

ERROR CORRECTION METHOD AND APPARATUS

CROSS REFERENCE TO RELATED APPLICATIONS

This application is a U.S. nationalization of International Application No. PCT/JP2006/315215, filed Aug. 1, 2006, designating the U.S., which claims the benefit of Japanese Patent Applications No. 2005-253275, filed on Sep. 1, 2005, and No. 2006-157186, filed on Jun. 6, 2006, the entire contents of which are incorporated herein by reference.

TECHNICAL FIELD

The present invention relates to an error correction technique for compensating for bit errors and packet losses in packet-type transmission systems such as ATM, IP, and LAN.

BACKGROUND ART

The FEC (forward error correction) method is known as a method for compensating for bit errors and losses in digital data. By the FEC method, the transmitting side encodes data according to an error correction code and the receiving side detects and corrects for errors or losses. Various codes such as the BCH code, Reed-Solomon code, and convolutional code have been proposed as error correction codes (refer to Non-patent document 1, for example).

An error correction code includes a bit string of (N+n) bits in which an n-bit error correction code is added to N-bit data which is called "codeword." With occurrence of bit errors in a codeword, the receiving side can detect error positions and hence can correct the errors completely as long as the number of errors is within the error correction capability. The error correction capability depends on the error correction code. For example, a (15, 10) Hamming code, that is, a Hamming code in which 15-bit codeword is formed by adding a 5-bit error correction code to 10-bit data, can correct a burst error of up to 2 bits. Although error detection codes as typified by the parity code and the CRC code add an error detection code to data like error correction codes do, they merely detect errors in codewords and cannot correct errors.

To cope with errors such as burst errors that are difficult to correct by an error correction code alone, various FEC methods have been proposed and used in which plural kinds of error correction codes are combined or an error correction code and an error detection code are combined.

The conventional FEC methods are generally classified into three. The first method is an FEC method which is used in a stream-type transmission system. The second method is an FEC method for compensating for packet losses in a packet-type transmission system. The third method is an FEC method for correcting for packet losses and bit errors in a packet in a packet-type transmission system. Conventional FEC methods will be described below with reference to FIGS. 6-9.

FIG. 6 is charts illustrating an FEC method which is used in a stream-type transmission system. FIG. 6($a$) shows a system using one kind of error correction code, and FIG. 6($b$) shows a system using two kinds of error correction codes.

In the system of FIG. 6($a$) which uses one kind of error correction code, in the transmitting side, transmission data are divided in units of a predetermined number of bits and codewords are generated by calculating an error correction code for each piece of divided data. In the receiving side, errors are corrected by using the error correction codes.

FIG. 6($b$) shows a system using a code called "product code" which is a combination of two kinds of error correction codes. As shown in FIG. 6($b$), data having a certain length are arranged in a matrix format. For example, first, error correction codes are calculated in the vertical direction (column direction) and an outer code which is an error correction code is added at the end of each column. The term "outer code" means a code, calculated first, of the two kinds of codes used.

Then, error correction codes are calculated in the horizontal direction (row direction) and an inner code which is an error correction code is added at the end of each row. The term "inner code" means a code, calculated later, of the two kinds of codes used.

In product codes, even when, for example, errors occur in one row due to a burst error in such a number as to exceed the error correction ability of the inner code, no burst error exists in the column direction and hence all the errors can be corrected by the outer codes. The error correction ability is thus increased. For example, in Japan, the ground-wave digital broadcast employs an FEC method using a product code in which the inner code and the outer code are a punctured convolutional code and a (204, 188) shortened Reed-Solomon code, respectively (refer to Non-patent documents 2 and 3, for example).

FIG. 7 is a chart illustrating an FEC method for compensating for a packet loss in a packet-type transmission system, which is described in Patent document 1. According to Patent document 1, as shown in FIG. 7, a parity cell having parity bits in a payload portion is transmitted following ATM cells having data A-D in payload portions. A parity bit for the kth bits of the data A-D is put in the kth bit of the payload portion of the parity cell. The ATM cells are assigned consecutive cell numbers in transmission order.

For example, when the ATM cell having the data B was lost, the receiving side can recognize the cell loss from the cell numbers and restore the data B using the parity cell. Although capable of compensating for a packet loss with a simple scheme, this system cannot correct bit errors. That is, when an error has occurred at the first bit of the data B, the parity cell can only judge that an error or errors have occurred in one or plural ones of the first bits of the data A-D.

FIGS. 8 and 9 are charts illustrating an FEC method for correcting for packet losses and errors in a packet in a packet-type transmission system, which is described in Non-patent document 4 and Patent documents 2 and 3, for example.

In this method, as shown in FIG. 8($a$), a data sequence is divided into data A-D having a predetermined length, which are then arranged in a matrix format. Outer codes A-D are calculated in the row direction and assigned to the data A-D, respectively. Then, inner codes are calculated in the column direction for the data and the outer codes, and an inner code Z is assigned to them. A product code is thus calculated.

Then, the data of each row is divided into data having an ATM cell size, which are transmitted in order from the first row of the matrix as ATM cells which are assigned respective cell numbers indicating the cell transmission order. In FIG. 8($b$), each piece of data is divided into two pieces of data.

In the receiving side, as shown in FIG. 9, the data are arranged in the same matrix format as in the transmitting side on the basis of the cell numbers. In doing so, dummy data is inserted for a lost cell (its disappearance can be detected according to the cell numbers). In FIG. 9, since the ATM cell of the data B-1 has disappeared, dummy data is inserted at the position of the data B-1. Data with errors cannot be detected at this stage, and hence data, if any, still having errors is included in the matrix. In FIG. 9, errors have occurred in the data D-2.

Subsequently, the data which are arranged in a matrix form are subjected to error correction processing using the inner codes and the outer codes, whereby the dummy data and the error are corrected. Unlike the scheme of Patent document 1 which has been described above with reference to FIG. 7, this method can also compensate for bit errors. However, this method has drawbacks of low transmission efficiency, a long delay, and a complexity of the circuit.

The low transmission efficiency is due to the presence of dedicated cells which contain outer codes. For example, Non-patent document 4 describes that a (442, 424) BCH code provides transmission efficiency of 21/22 and a (460, 424) BCH code provides transmission efficiency of 10/11.

A long delay occurs at the time of error correction in the receiving side, and depends on the time taken to receive all codewords, that is, data, inner codes, and outer codes. For example, Non-patent document 4 describes a method in which a (460, 424) BCH code is used as the outer code and a (15, 14) parity code is used as the inner code, the codeword length in the horizontal direction (data plus an outer code) is 11 cells, the codeword length in the vertical direction (data plus an inner code) is 15 cells, and the codeword length of the entire product code is 11×15=165 cells. That is, the time taken to receive 165 cells determines the delay time.

Furthermore, where an error correction code is used for each of the inner code and the outer code, a complex circuit configuration is necessary. Incidentally, an error correction encoder which performs error correction encoding, an error corrector which performs error correction according to an error correction code, an error detection encoder which performs error detection encoding, and an error detector which performs error detection according to an error detection code are described in Non-patent document 5, for example.

A method for performing two-dimensional encoding according to the turbo product code like a method using a product code has been proposed. However, the turbo product code requires a large amount of calculation. In particular, in decoding, repetitive operations are necessary and the processing becomes complex. A method using the turbo product code is described in Patent document 4, for example.

Patent document 1: Japanese Patent No. 2,762,815

Patent document 2: JP-A-03-254240

Patent document 3: JP-A-04-207734

Patent document 4: US 2004-0260996A1

Non-patent document 1: "Electronics Essentials No. 20, Essential Points of Error Correction Codes," supervised by Hideki Imai, Japan Industry Center.

Non-patent document 2: "Digital Broadcasting Systems Handbook," supervised by Osamu Yamada, edited by the Institute of Image Information and Television Engineers, Ohmsha Ltd., pp. 18-19.

Non-patent document 3: ITU-R Recommendation BT. 1306-1

Non-patent document 4: Ryoichi Iwase and Hitoshi Obara, "A Bit Error and Cell Loss Compensation Method for ATM Transport Systems," Japanese-language Transactions of the Institute of Electronics, Information and Communication Engineers, J75-B1, No. 1, pp. 1-11, January 1992.

Non-patent document 5: "Application Examples of Error Correction Encoding Techniques <Digital Recording Edition>," supervised by Hiroshi Harashima, published by Triceps Co., Ltd., pp. 43-44 and pp. 67-68

DISCLOSURE OF THE INVENTION

Problems to be Solved by the Invention

An object of the present invention is to provide an error correction method, an error correction encoding apparatus, and an error correction decoding apparatus which can compensate for packet losses and bit errors in a packet, realize efficient transmission with less delay by a simple circuit.

Means for Solving the Problems

The invention provides an error correction method of encoding, by a transmitting apparatus, data as a transmission subject in every predetermined number of bits and transmitting the data in form of packets, and compensating for one or more bit errors in a packet and one or more packet losses by a receiving apparatus. The method includes the steps of arranging data in a matrix, calculating error correction codes in a column direction of the data arranged in the matrix; and arranging the calculated error correction codes in a matrix having the same number of columns as the matrix of the data; attaching number information corresponding to a row number to each row having data or an error correction code; and encapsulating, into each packet, each row having the number information and the data or error correction code as well as an error detection code for detection of one or more bit errors at least in the number information and the data or error correction code contained in the packet, to transmit the packet. The above steps are performed by the transmitting apparatus. The method also includes the steps of, by the receiving apparatus, discarding a received packet from which one or more errors have been detected, using an error detection code contained in the received packet; checking according to the number information contained in packets whether one or more packets have been lost; and restoring lost data using the error correction code.

According to another aspect of the error correction method of present invention, it is preferable that the data restoring step also use number information of a packet that has not been detected as a lost packet in the packet loss checking step.

The invention provides an error correction encoding apparatus which includes an error correction encoding part which arranges input data of a predetermined number of bits in a matrix, calculates error correction codes for respective columns, and adds the calculated error correction codes to the respective columns; a number information attaching part which attaches number information corresponding to a row number to each row that is output from the error correction encoding part; an error detection encoding part which attaches, to each row that is output from the number information attaching part, an error detection code for detection of one or more bit errors in the row; and a packet transmitting part which encapsulates, into each packet, each row that is output from the error detection encoding part, to transmit the packet.

The invention also provides an error correction decoding apparatus which receives and decodes packets that are transmitted from the above error correction encoding apparatus. The error correction decoding apparatus includes an error detecting part which decodes an error detection code contained in each packet, and outputs only a set of number information and data from which no error has been detected or a set of number information and an error correction code from which no error has been detected; and an error correcting part which arranges data and error correction codes output from the error detecting part in a matrix so that the data or error correction codes are in rows in association with the number information that is output together with the data or error correction code, to perform error correction for each column according to the error correction code contained in each column.

According to another aspect of the error correction decoding apparatus of present invention, it is preferable that the error correcting part use, for the error correction, the number information that is output from the error detecting part together with the data or error correction codes.

ADVANTAGEOUS EFFECT OF THE INVENTION

The present invention provides, as one of the codes constituting a product code, an error detection code which is smaller in the number of bits to be added than an error correction code and can be obtained by a simple circuit. Transmitting an error detection code as part of the same packet containing data or an error correction code makes it possible to decrease the degree of redundancy and thereby realize efficient transmission with less delay as well as to compensate for both of one or more packet losses and bit errors in a packet. Also, it realizes simplification of configuration of the encoding apparatus and the decoding apparatus.

Furthermore, the present invention offers advantageous effects that since number information is attached to respective packets, it is possible to know a vertical position of a non-received packet, using the number information, and to enhance the error correction performance to such an extent as to enable use of such a simple error correction code as a single-error correction code.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 3 is a chart illustrating decoding of the error correction method according to present invention.

FIG. 9 is another chart illustrating the FEC method for correcting for a packet loss and bit errors in a packet in the packet-type transmission system.

BEST MODE FOR CARRYING OUT THE INVENTION

The best mode for carrying out the present invention will be hereinafter described in detail with reference to the drawings.

Figure 1:
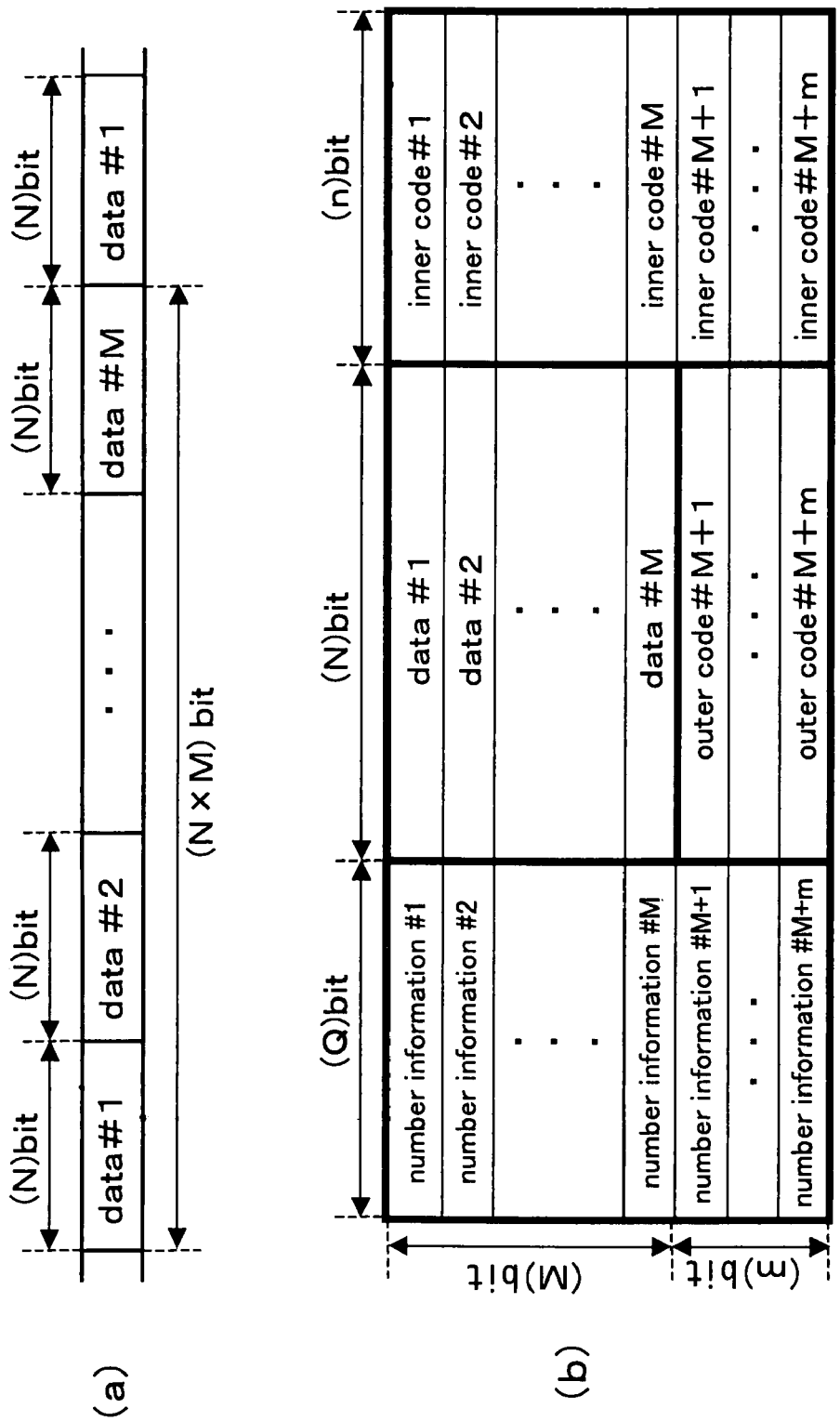
FIG. 1 is charts illustrating error correction encoding according to present invention.

FIG. 1 is charts illustrating encoding of the error correction according to present invention. As shown in FIG. 1(a), a transmitting apparatus performs encoding processing by dividing transmission data in units of N bits and arranging M pieces of N-bit data (data #1 to #M) in a matrix format. That is, the transmitting apparatus performs encoding processing on an (N×M) bit basis. Symbols N and M represent predetermined natural numbers. Although FIG. 1 is directed to a case that transmission data are arranged in ascending order of rows from the first row, there are no limitations on the arrangement order of (N×M)-bit data as long as the same arrangement order is employed in the transmitting side and the receiving side; for example, transmission data may be arranged in ascending order of columns from the first column.

Then, encoding is performed in the vertical direction (column direction) according to an error correction code, whereby outer codes (error correction codes) are obtained. As shown in FIG. 1(b), in this example, an m-bit error correction code is generated as an outer code for each piece of M-bit data and the generated m-bit outer code is added to the calculation subject column. Therefore, resulting outer codes constitute an m-row/N-column matrix. As shown in FIG. 1(b), the kth-bit row of those outer codes will be called "outer code #M+k" ($1 \leq k \leq m$).

Subsequently, Q-bit number information is attached, at the head, to each of the rows of the data #1 to #M and the outer codes #M+1 to #M+m. The number information is information indicating a row number. As shown in FIG. 1(b), the number information of the kth row will be called "number information #k" ($1 \leq k \leq M+m$).

Finally, encoding is performed according to the error correction code on each row which consists of (Q+N) bits, whereby inner codes (error detection codes) are obtained. As shown in FIG. 1(b), in this example, an n-bit error detection code is generated as an inner code for each set of (Q+N) bits and the generated n-bit inner code is attached to the calculation subject row. As shown in FIG. 1(b), the inner code of the kth row will be called "inner code #k" ($1 \leq k \leq M+m$).

Figure 2:
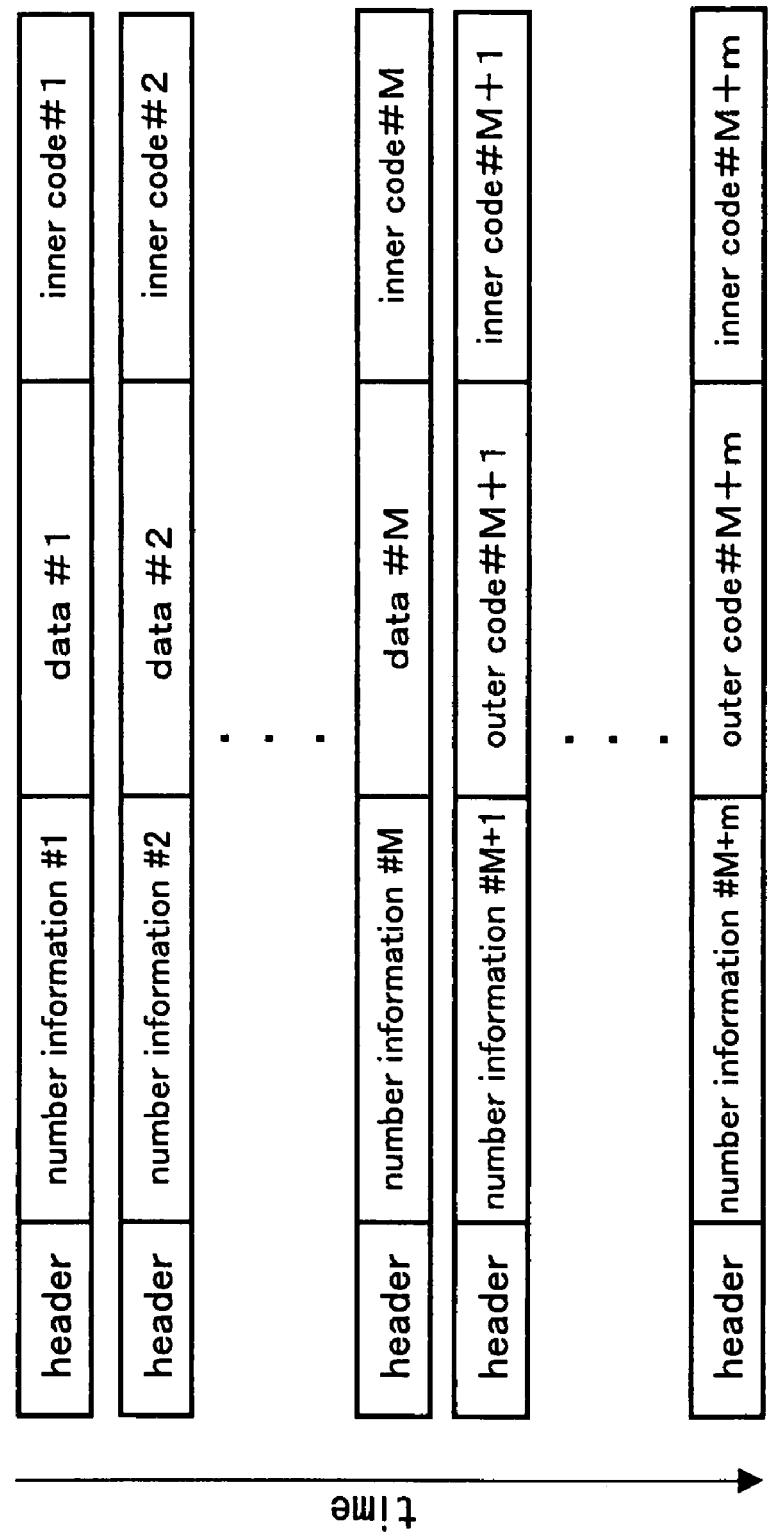
FIG. 2 is a chart showing transmission packets of an error correction method according to present invention.

FIG. 2 is a chart showing transmission packets of the error correction method according to present invention. The transmitting apparatus attaches a packet header to each (Q+N+n)-bit row shown in FIG. 1(b) and transmits a resulting packet in the form of a single packet. That is, the transmitting apparatus transmits the (N×M)-bit data in the form of (M+m) packets.

In a receiving apparatus, first, whether or not one or more errors have occurred in each reception packet is checked by using the inner code (error detection code) which necessarily exists in the reception packet. If one or more errors are detected, the packet concerned is discarded. Then, based on the pieces of number information of the reception packets, the payload portions excluding the number information, that is, the portions including data or an outer code, are arranged in a matrix format. In doing so, proper dummy data may be used for a packet that has been discarded by the error detection or a packet that has not been received because of a loss in a network. FIG. 3 is a chart illustrating decoding of the error correction method according to present invention. In FIG. 3, dummy data is placed at the position of the data #4 because one or more errors have been detected in the data #4 or the packet of the data #4 has not been received.

Finally, the receiving apparatus performs error correction on the dummy data using the correctly received pieces of number information and outer codes.

In the above example, the transmitting apparatus attaches a packet header to each (Q+N+n)-bit row and transmits a resulting packet. However, each packet may contain other bits such as a padding for a bit adjustment. In this case, the other bits may be placed in the detection subject range of the error detection code. That is, the only requirements are that the detection subject range of the error detection code includes at least the Q-bit number information and the N-bit data or outer code, that the receiving apparatus be able to discriminate between the Q-bit number information, the N-bit data or outer code, the n-bit error detection code, and the other bits, and that the subject range of the n-bit error detection code be common to the transmitting apparatus and the receiving apparatus. Although a processing delay in each block is a factor in rendering data, a clock signal, or each control signal out of synchronization, it can be compensated for by inserting a proper delay circuit. Such a delay circuit will be omitted in the following description.

Figure 4:
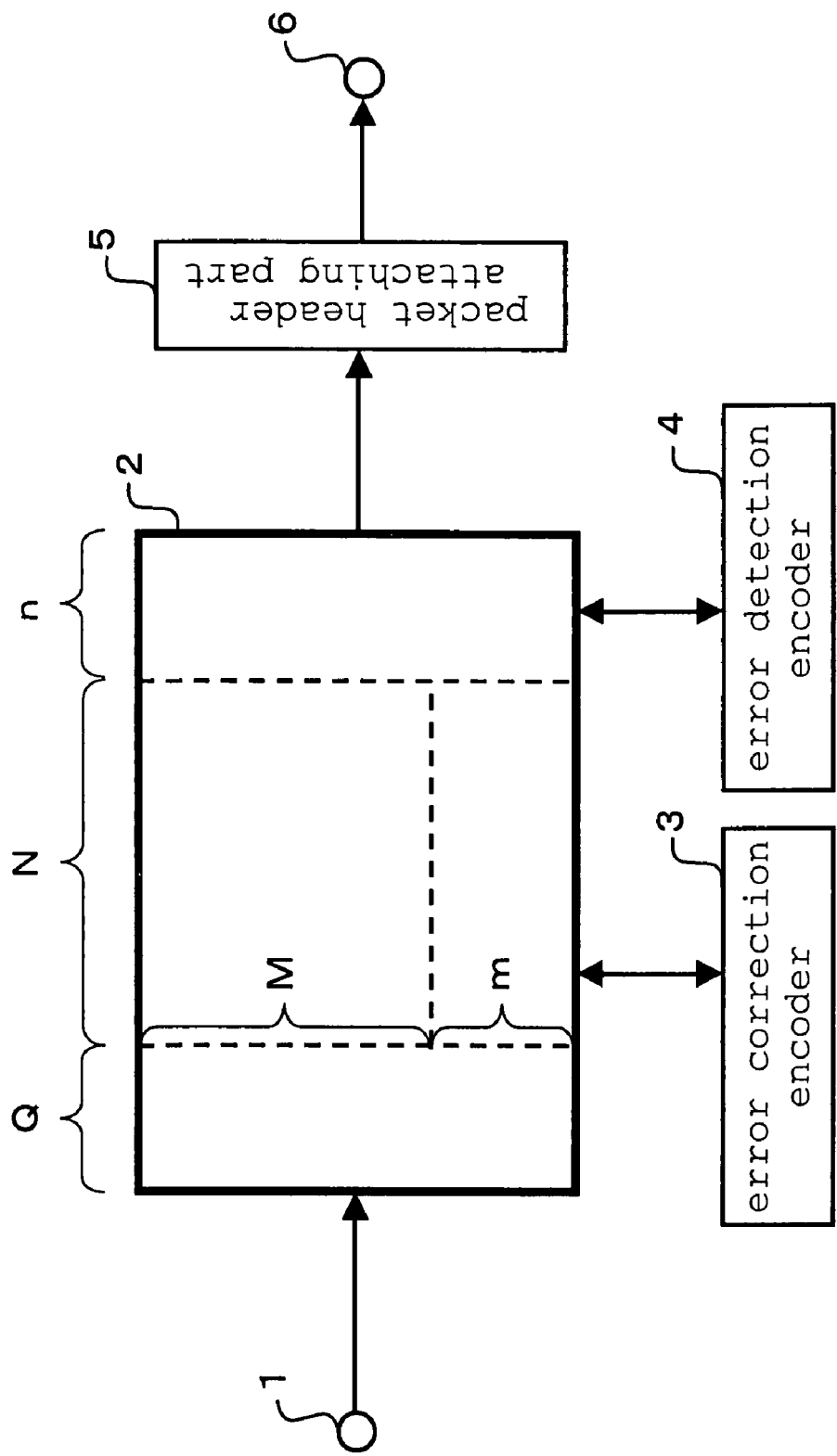
FIG. 4 is a block diagram of an error correction encoding apparatus according to present invention.

FIG. 4 is a block diagram of an error correction encoding apparatus, that is, a transmitting apparatus, according to present invention. As shown in FIG. 4, the error correction encoding apparatus is equipped with a RAM (random access memory) 2, an error correction encoder 3, an error detection encoder 4, and a packet header attaching part 5. Symbol 1 denotes a data input port and symbol 6 denotes a packet output port.

Transmission data that are input to the data input port 1 are processed on an (N×M) bit basis as described above with reference to FIG. 1(b), and are sequentially written to the M-row/N-column top-middle region among divisional regions of the RAM 2 indicated by broken lines in FIG. 4.

Q-bit number information is stored in each of the respective rows, that is, the first to (M+m)th rows, of the left-hand Q columns of the RAM 2. Pieces of number information may be written when transmission data are written to the respective rows or written as fixed values when the RAM 2 is initialized.

After transmission data have been written to the M-row/N-column region of the RAM 2, the error correction encoder 3 generates error correction codes for the respective columns of the transmission data. And the error correction encoder 3 stores each generated error correction code in the (M+1)th-row position to the (M+m)th-row position of the same column as the corresponding correction subject of the transmission data is stored. This processing is performed on all the transmission data, that is, for the (Q+1)th to (Q+N)th columns of the RAM 2. The error correction encoder 3 may process plural columns in parallel each time rather than processes one column each time, which can reduce the processing time. The processing time can be also reduced by sequentially generating error correction codes and storing them for the columns in which data has been stored in all the row positions, instead of generating error correction codes and storing them after all of (N×M)-bit transmission data have been stored in the M-row/N-column region of the RAM 2.

The error correction code used may be a non-binary code. In this case, error correction encoding is performed with plural bits as a minimum unit. For example, where a Reed-Solomon code RS(255, 239) is used, calculations are performed with 8 bits as an encoding unit.

Then, the error detection encoder 4 generates error detection codes for the data of the respective rows, and stores each generated error detection code in the (Q+N+1)th-column position to the (Q+N+n)th-column position of the corresponding error detection subject row. Like the error correction encoder 3, the error detection encoder 4 may process plural rows in parallel each time rather than processes one row each time, which can reduce the processing time. The processing time can be also reduced by generating error detection codes and storing them for the rows in which data has been stored in all the positions, instead of generating error detection codes and storing them after necessary data, that is, the number information, the transmission data, and the error correction codes, have been stored in the entire (Q+N)×(M+m) region of the RAM 2.

The packet header attaching part 5 receives data of each row of the RAM 2, that is, data including number information, transmission data or an error correction code, an error detection code, attaches a packet header to the data, and outputs a resulting packet to the packet output port 6.

Figure 5:
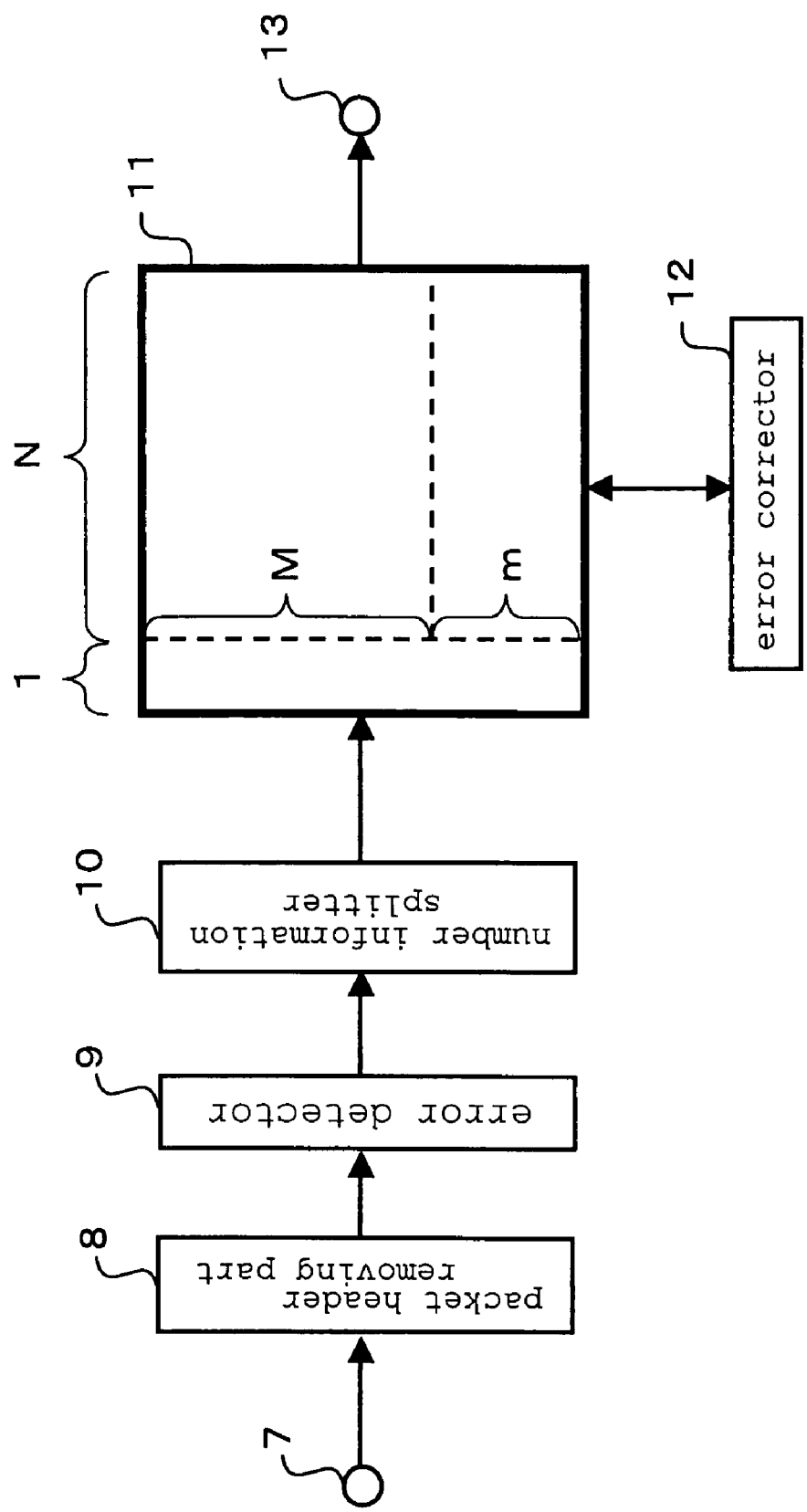
FIG. 5 is a block diagram of an error correction decoding apparatus according to present invention.
Figure 6:
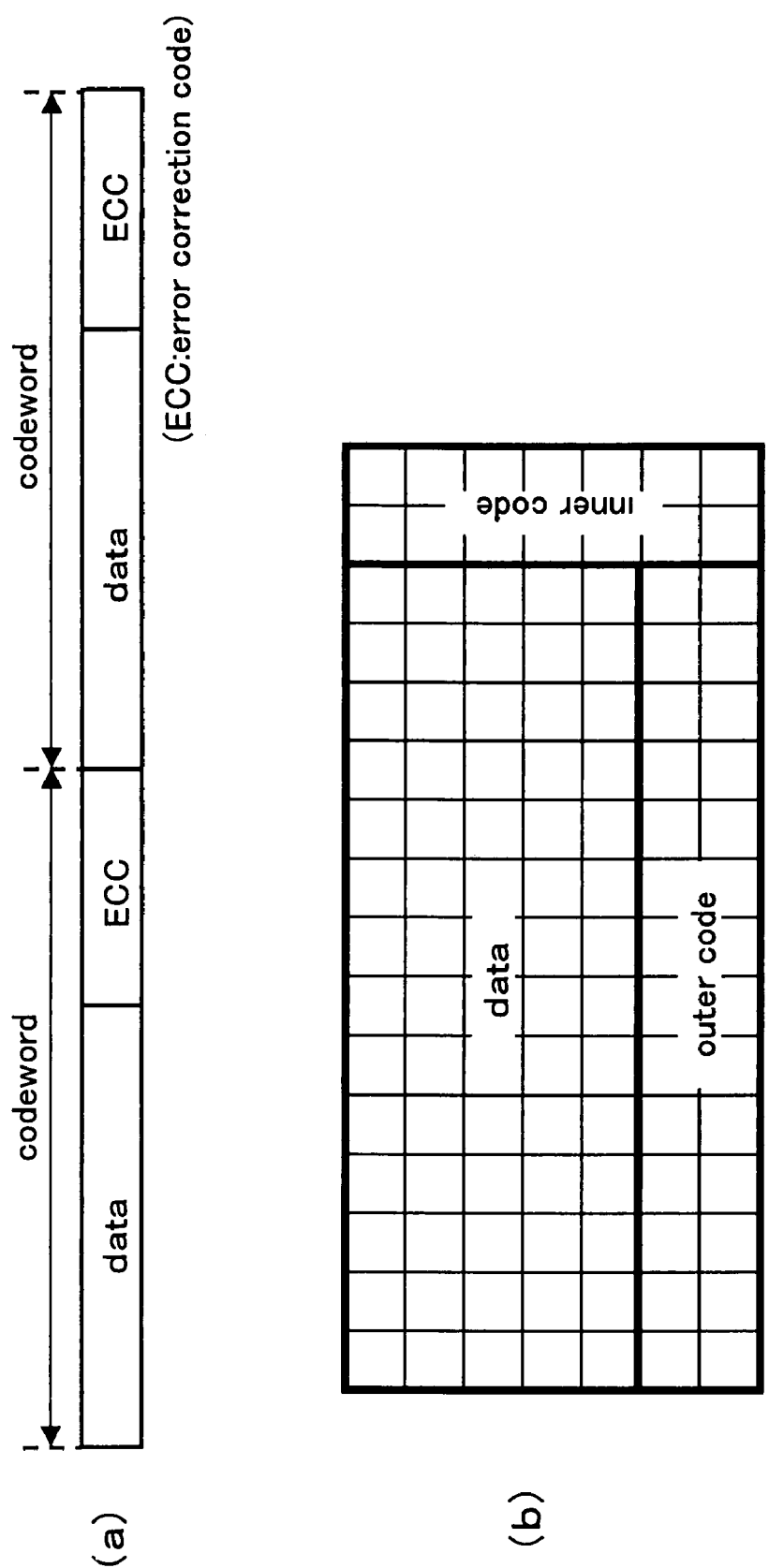
FIG. 6 is charts illustrating an FEC method which is used in a stream-type transmission system.
Figure 7:
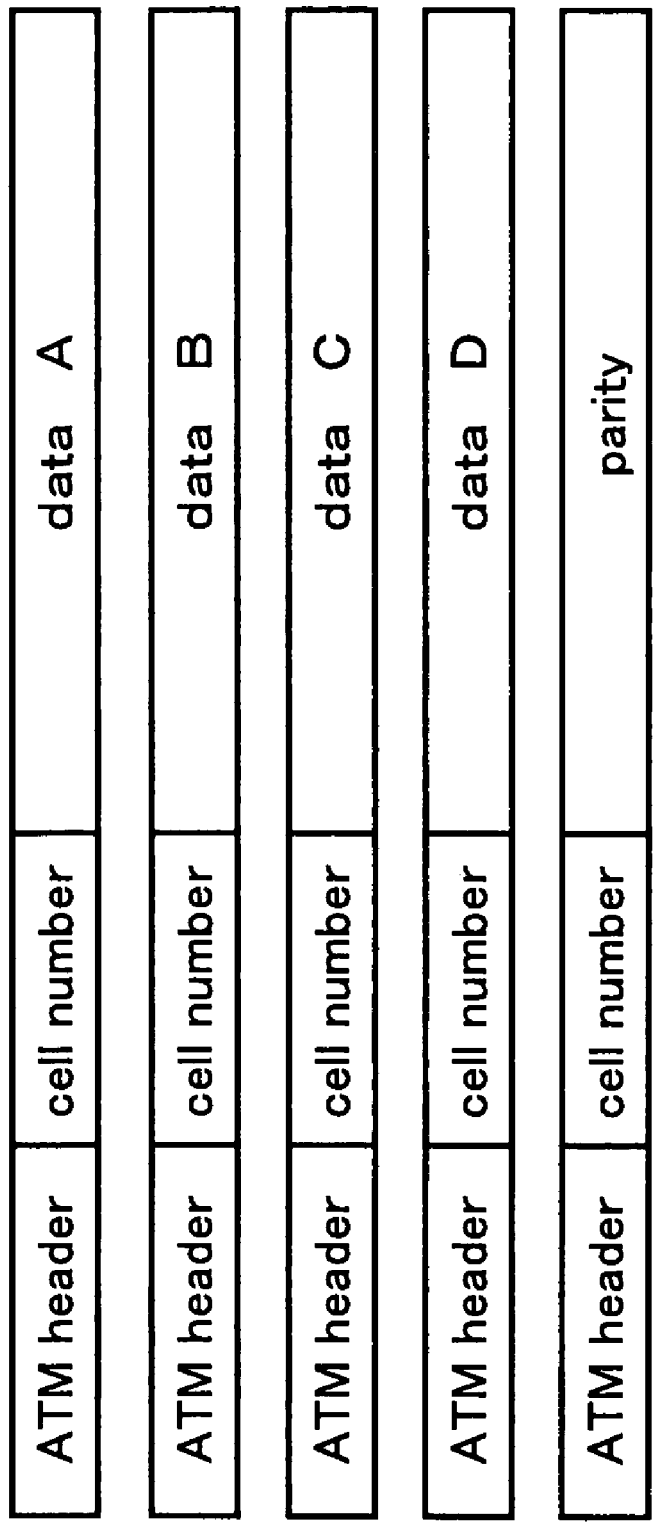
FIG. 7 is a chart illustrating an FEC method for compensating for a packet loss in a packet-type transmission system.
Figure 8:
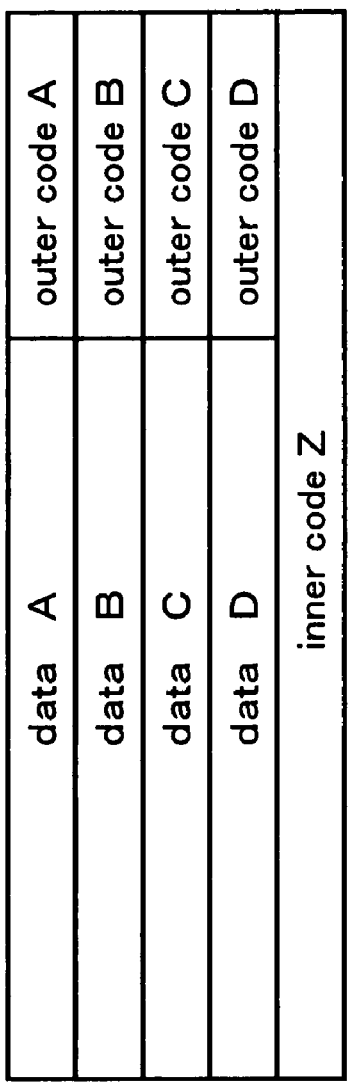
FIG. 8 is charts illustrating an FEC method for correcting for a packet loss and bit errors in a packet in a packet-type transmission system.
Figure 8:
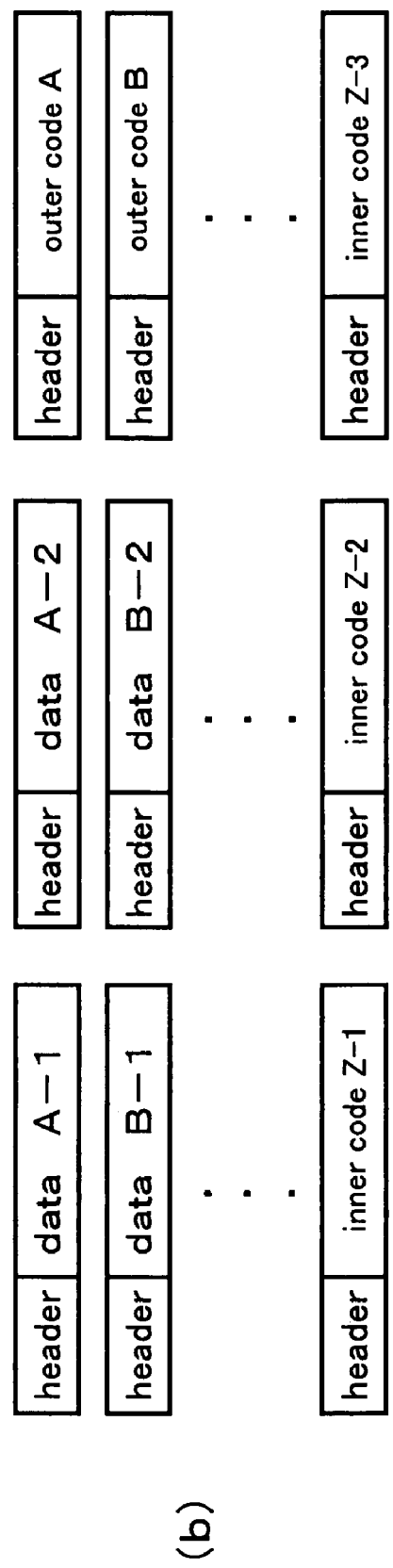

FIG. 5 is a block diagram of an error correction decoding apparatus, that is, a receiving apparatus, according to present invention. As shown in FIG. 5, the error correction decoding apparatus is equipped with a packet header removing part 8, an error detector 9, a number information splitter 10, a RAM 11, and an error corrector 12. Symbol 7 denotes a packet input port and symbol 13 denotes a data output port.

The packet header removing part 8 terminates the header of a packet that is input from the packet input port 7, and outputs, to the error detector 9, a (Q+N+n)-bit payload portion containing number information, data or an error correction code, and an error detection code.

Based on the error detection code, the error detector 9 checks whether or not one or more errors have occurred in the input number information plus data or error correction code. If not detecting any errors, the error detector 9 outputs the number information plus the data or error correction code to the number information removing part 10. If detecting any error(s), the error detector 9 outputs nothing to the number information removing part 10.

The number information removing part 10 terminates the number information of the input number information plus data or error correction code, stores the data or error correction code in the second-column position to the (N+1)th-column position of the row, corresponding to the number information, of the RAM 11, and sets the value of the first-column position of the same row at "0."

The first column of the RAM 11 is a packet discard flag region indicating occurrence/non-occurrence of a packet discard, the first to Mth rows of the second to (N+1)th columns are a region for storing data, and the (M+1)th to (M+m)th rows of the same columns are a region for storing error correction codes. The packet discard flag indicates whether or not the data or error correction code of the same row has been received normally. The packet discard flag indicates that the data or error correction code has been received without occurrence of any errors if its value is "0," and indicates that the data or error correction code has been discarded or one or more errors have been detected if its value is "1." The values of all the packet discard flags are set at "1" when the RAM 11 is initialized and every time the data processing on (N×M) bits is completed.

If at least one of the values of the packet discard flags of the first to Mth rows is "1," the error corrector 12 performs error correction on the data of the second to (N+1)th columns of the RAM 11 on the basis of the error correction codes and the values of the packet discard flags. The error corrector 12 starts error correction as soon as the error correction decoding apparatus has received (M+m) packets or a sufficient time for receiving (M+m) packets has elapsed from reception of a first packet. The error corrector 12 may process plural columns in parallel each time rather than processes one column each time. The data are then output to the data output port 13.

A specific example of error correction will be described below. For example, it is assumed that the error correction code is of an even parity type. In this case, the number m is equal to 1 and an error correction code for each column is generated so that the number of 1 s becomes even. If the error correction decoding apparatus has received (M+1) packets and one of them has been discarded because one or more errors have been detected there, only the packet discard flag of that row becomes "1." In this case, an (M+1)-row/N-column matrix $D^*_{M+1,N}$ in which the one discarded row is restored is calculated according to the following equation:

$$D^*_{M+1,N} = [I_{M+1} + F_{M+1} \cdot E_{M+1}] D_{M+1,N} \quad (1)$$

where $D_{M+1,N}$ is an (M+1)-row/N-column matrix whose elements are signals of the second to (N+1)th columns of the RAM 11, $F_{M+1}$ is a vertical vector having a length (M+1) which represents packet discard flags, $I_{M+1}$ is an (M+1)-row/(M+1)-column identity matrix, and $E_{M+1}$ is a horizontal vector having a length (M+1) all of whose components are "1." Equation (1) is operated based on modulo 2. For example, assume that N is equal to 8, M is equal to 4, and transmission data are $$\begin{pmatrix} 0 & 0 & 0 & 0 & 0 & 0 & 0 & 1 \\ 0 & 0 & 0 & 0 & 0 & 0 & 1 & 0 \\ 1 & 1 & 1 & 1 & 0 & 0 & 1 & 1 \\ 1 & 1 & 1 & 1 & 0 & 1 & 0 & 0 \end{pmatrix} \quad \text{[Formula 1]}$$

Then, an outer code becomes [0 0 0 0 0 1 0 0]. If the receiving apparatus has discarded the second packet because one or more errors have been detected there, the (M+1)-row/(N+1)-column memory contents of the RAM 11 become $$\begin{pmatrix} 0 & 0 & 0 & 0 & 0 & 0 & 0 & 1 \\ 1 & x & x & x & x & x & x & x \\ 0 & 1 & 1 & 1 & 1 & 0 & 0 & 1 & 1 \\ 0 & 0 & 0 & 0 & 0 & 0 & 1 & 0 & 0 \end{pmatrix} \quad \text{[Formula 2]}$$

where x means an indefinite value caused by the discard. In this case, the variables on the right side of Equation (1) are given by $$I_{M+1} = \begin{pmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{pmatrix} \quad \text{[Formula 3]}$$

$$F_{M+1} = \begin{pmatrix} 0 \\ 1 \\ 0 \\ 0 \\ 0 \end{pmatrix}$$

$$E_{M+1} = [1 \ 1 \ 1 \ 1 \ 1]$$

$$D_{M+1,N} = \begin{pmatrix} 0 & 0 & 0 & 0 & 0 & 0 & 0 & 1 \\ x & x & x & x & x & x & x & x \\ 1 & 1 & 1 & 1 & 0 & 0 & 1 & 1 \\ 1 & 1 & 1 & 1 & 0 & 1 & 0 & 0 \\ 0 & 0 & 0 & 0 & 0 & 1 & 0 & 0 \end{pmatrix}$$

Substituting the above into Equation (1), we obtain $$D^*_{M+1,N} = \begin{pmatrix} 0 & 0 & 0 & 0 & 0 & 0 & 0 & 1 \\ 0 & 0 & 0 & 0 & 0 & 0 & 1 & 0 \\ 1 & 1 & 1 & 1 & 0 & 0 & 1 & 1 \\ 1 & 1 & 1 & 1 & 0 & 1 & 0 & 0 \\ 0 & 0 & 0 & 0 & 0 & 1 & 0 & 0 \end{pmatrix} \quad \text{[Formula 4]}$$

It is confirmed that the top four rows including the second row coincide with the transmission data. Equation (1) includes only matrix addition and multiplications and can easily be implemented.

Usually, a code whose minimum Hamming distance is 3 bits or more is necessary for 1-bit error correction. In the case of 4-bit data, an error correction code of at least 3 bits is necessary. For example, a binary (7, 4) BCH code is a code in which the error correction code consists of 3 bits. In this numerical example, the error correction code is a 1-bit code. Therefore, the amount of information to be transmitted is smaller and the signal transmission bandwidth can be reduced. Since the error correction code only serves to detect an error, it may be a simple code such as a parity bit code. Where present invention is applied to packets which themselves have an error detecting function such as Ethernet (registered trademark) frames, it is not necessary to newly add an error detection code and the bandwidth is saved accordingly.

As described above, an error detection code which is smaller in the number of bits to be added and can be implemented by a simpler circuit configuration than an error correction code is employed as one of the codes constituting a product code and an error detection code is transmitted as part of the same packet containing data or an error correction code. This makes it possible to decrease the degree of redundancy and thereby realize a small delay and high efficiency while compensating for both of packet losses and bit errors in a packet, as well as to simplify an error correction encoding apparatus and decoding apparatus. Furthermore, in the error correction decoding apparatus, packet discard position(s) in the vertical direction are recognized on the basis of pieces of number information of respective packets, which provides an advantage that the correction performance is increased to such an extent as to enable use of a simple error correction code such as a single-error correction code.

The invention is not limited to the above embodiments and various modifications may be made without departing from the spirit and scope of the invention. Any improvement may be made in part of some or all of the components.

The invention claimed is:

1. In a packet-type transmission system, an error correction method of encoding, by a transmitting apparatus, data as a transmission subject in every predetermined number of bits and transmitting the data in form of packets, and compensating for one or more bit errors in a packet and one or more packet losses by a receiving apparatus, comprising the steps of:

by the transmitting apparatus, arranging data in a matrix defining a predetermined number of ordered rows;

calculating error correction codes in a column direction of the data arranged according to the ordered rows of the matrix, and arranging the calculated error correction codes in a matrix having a same number of columns as the matrix of the data;

attaching, to each row having data or an error correction code, number information corresponding to a row number that uniquely identifies each of the predetermined number of ordered rows;

storing, into each packet, either the number information and the data or the number information and the calculated error correction codes in each row by attaching corresponding error detection code for detection of a bit error, to transmit the packet; and by said receiving apparatus, detecting, on a row basis, a bit error of either the number information and the data or the number information and the calculated error correction codes, using an error detection code of the received packet;

checking according to the number information contained in the packet whether a packet loss has occurred; and restoring lost data using the error correction code.

2. The method according to claim 1, wherein the data restoring step also uses the number information of a packet that has not been detected as a lost packet in the packet loss checking step.

3. In a packet-type transmission system, an error correction encoding apparatus comprising:

an error correction encoding part which arranges input data of a predetermined number of bits in a matrix that defines a predetermined number of ordered rows, calculates error correction codes for respective columns according to the ordered rows, and adds the calculated error correction codes to the respective columns;

a number information attaching part which attaches number information corresponding to a row number to each row that is output from said error correction encoding part where the number information uniquely identifies each of the predetermined number of ordered rows;

an error detection encoding part which attaches an error detection code for detection of a bit error corresponding to either the number information and the input data or the number information and the calculated error correction codes in each row; and a packet transmitting part which stores, into each packet, each row that is output from said error detection encoding part, to transmit the packet.

4. An error correction decoding apparatus which receives and decodes a packet that is transmitted from the error correction encoding apparatus according to claim 3, comprising:

an error detecting part which decodes an error detection code contained in each packet, and outputs only a set of number information and data from which no error has been detected or a set of number information and an error correction code from which no error has been detected; and an error correcting part which arranges data and error correction codes output from said error detecting part in a matrix, so that the data or the error correction codes are in rows in association with the number information that is output together with the data or the error correction codes, to perform error correction for each column according to the error correction code contained in each column.

5. The error correction decoding apparatus according to claim 4, wherein said error correcting part also uses, for the error correction, the number information that is output from said error detecting part together with the data or error correction codes.

* * * * *